(12) United States Patent
Qin

(10) Patent No.: US 9,583,690 B2
(45) Date of Patent: Feb. 28, 2017

(54) LED LAMPWICK, LED CHIP, AND METHOD FOR MANUFACTURING LED CHIP

(75) Inventor: Biao Qin, Shenzhen (CN)

(73) Assignee: Shenzhen Qin Bo Core Technology Development Co., Ltd., Shenzhen, Guangdong Province (CN)

( * ) Notice: Subject to any disclaimer, the term of this patent is extended or adjusted under 35 U.S.C. 154(b) by 108 days.

(21) Appl. No.: 13/636,661

(22) PCT Filed: Apr. 7, 2010

(86) PCT No.: PCT/CN2010/071583
§ 371 (c)(1),
(2), (4) Date: Sep. 21, 2012

(87) PCT Pub. No.: WO2011/124019
PCT Pub. Date: Oct. 13, 2011

(65) Prior Publication Data
US 2013/0010481 A1 Jan. 10, 2013

(51) Int. Cl.
*F21S 4/00* (2016.01)
*F21V 21/00* (2006.01)
(Continued)

(52) U.S. Cl.
CPC .............. *H01L 33/642* (2013.01); *F21K 9/20* (2016.08); *F21V 29/89* (2015.01); *F21V 23/002* (2013.01);
(Continued)

(58) Field of Classification Search
CPC ..... F21K 9/30; F21K 9/00; F21K 9/20; H01L 33/642; H01L 33/647; H01L 2224/48091; H01L 2224/48464; H01L 2224/73265; H01L 2224/13; H01L 2924/00014; H01L 33/64; F21V 29/89; F21V 23/002; F21V 29/85; F21Y 2101/02
(Continued)

(56) References Cited

U.S. PATENT DOCUMENTS 7,192,163 B2 *  3/2007  Park .............................. 362/294
7,549,773 B2 *  6/2009  Lim .............................. 362/294
(Continued)

*Primary Examiner* — Jason Moon Han
(74) *Attorney, Agent, or Firm* — Novoclaims Patent Services LLC

(57) ABSTRACT

An LED lamp core, an LED chip, and a method for manufacturing the LED chip are provided. A heat conductive core (6) using the structure of taper column or taper threaded column can be conveniently installed, and solves the heat conductive problem from the standardization of the LED lamp core. A heat diffusion plate (2) is made of copper or aluminum, and the area and the thickness thereof should be large enough, so as to achieve the effect of heat diffusion. A wafer (1) is welded on the heat diffusion plate (2), reducing the temperature difference between the wafer (1) and the heat diffusion plate (2) is primary and the insulation between the same is secondary. A high voltage insulation layer (4), which is required for safety, is provided between the heat diffusion plate (2) and the heat conductive core (6), and the heat flux density between the heat diffusion plate (2) and the heat conductive core (6) has already been reduced by the heat diffusion plate (2). The technique using a wafer locating plate solves the problem of aligning weld, costly equipment and low production efficiency.

20 Claims, 7 Drawing Sheets

(51) Int. Cl.
*H01L 33/64* (2010.01)
*F21V 29/89* (2015.01)
*F21V 23/00* (2015.01)
*F21Y 101/00* (2016.01)

(52) U.S. Cl.
CPC ......... *F21Y 2101/00* (2013.01); *H01L 33/647* (2013.01); *H01L 2224/13* (2013.01); *H01L 2224/48091* (2013.01); *H01L 2224/48464* (2013.01); *H01L 2224/73265* (2013.01)

(58) Field of Classification Search
USPC ...... 362/294, 249.02, 800; 257/99, E33.066, 257/E33.075
See application file for complete search history.

(56) References Cited

U.S. PATENT DOCUMENTS

| | | | |
|---|---|---|---|
| 7,621,654 B2 * | 11/2009 | Nishimoto et al. | 362/241 |
| 2005/0152146 A1 * | 7/2005 | Owen et al. | 362/294 |
| 2006/0098440 A1 * | 5/2006 | Allen | 362/294 |
| 2007/0181895 A1 * | 8/2007 | Nagai | 257/98 |
| 2008/0074883 A1 * | 3/2008 | Li | 362/294 |
| 2008/0266869 A1 * | 10/2008 | Tai et al. | 362/294 |
| 2009/0046456 A1 * | 2/2009 | Urano et al. | 362/235 |
| 2009/0154166 A1 * | 6/2009 | Zhang et al. | 362/294 |
| 2009/0219719 A1 * | 9/2009 | Hsu et al. | 362/249.02 |
| 2009/0289273 A1 * | 11/2009 | Tsai et al. | 257/98 |
| 2010/0046232 A1 * | 2/2010 | Matsui et al. | 362/294 |
| 2010/0051994 A1 * | 3/2010 | Katsuno et al. | 257/98 |
| 2010/0123164 A1 * | 5/2010 | Suehiro et al. | 257/99 |
| 2011/0090691 A1 * | 4/2011 | Markle et al. | 362/249.02 |

* cited by examiner

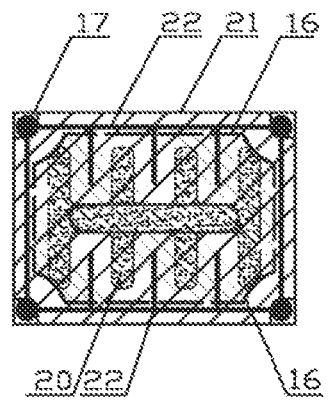
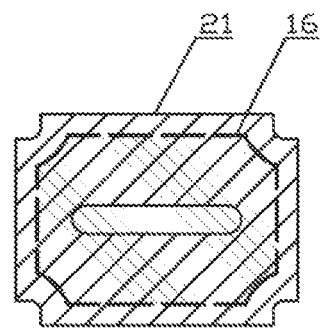
FIG. 11  FIG. 12
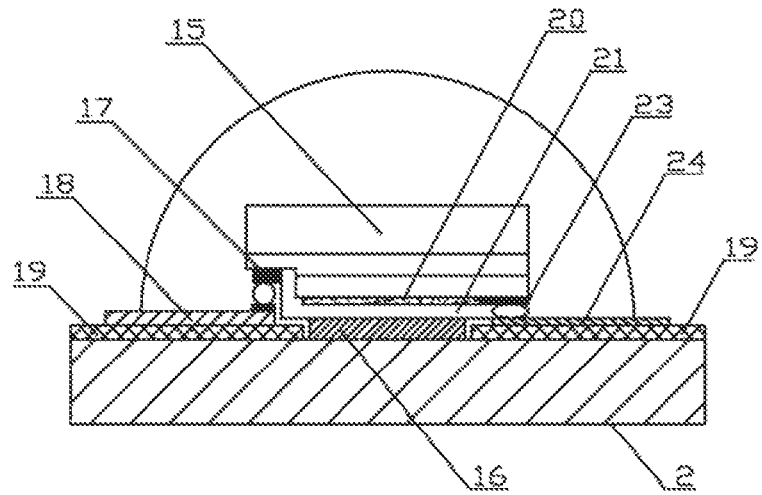
FIG. 13
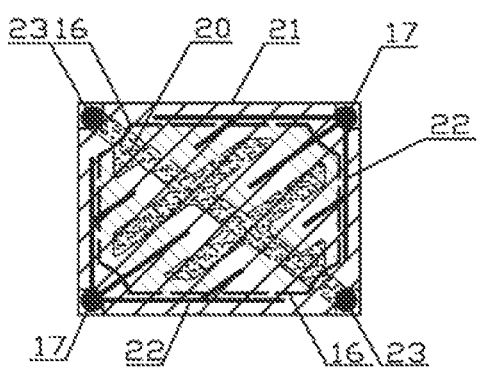
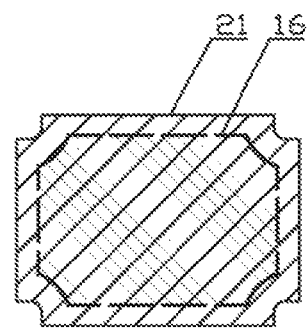
FIG. 14  FIG. 15

LED LAMPWICK, LED CHIP, AND METHOD FOR MANUFACTURING LED CHIP

BACKGROUND OF THE PRESENT INVENTION

Field of Invention

The present invention relates to the LED technical field and more particularly to a heat conductive technology for an LED lamp core and the interior of an LED chip.

Description of Related Arts

The heat dissipating problem is a key technical problem serving as a bottleneck for the wide spreading of the LED illumination. Since an LED chip requires to dissipate heat, it is hard for an LED illuminating lamp to perform like an incandescent lamp, fluorescent lamp, and etc. with the light bulb being as a standardized component as well as be convenient to assemble, so that the cost is even higher.

An analysis from a single viewpoint of heat transmission theory suggests that the heat dissipating process of LEDs is not complicated. However, the heat transmission theory, mature heat transmission technology, and other basic knowledge related to heat transmission are not fully acknowledged by the people skilled in the art of LEDs, so that the current LED heat dissipating technology and products are complicated.

A heat transferring process from an LED node to an air convection heat exchanging surface (radiator) is a heat conduction process. Because an area of an LED chip is relatively small whilst a heat flux density is significantly high, the heat conduction process actually plays a very important role in the whole LED heat dissipating procedure. An effective and simple solution for reducing a heat resistance of the heat conduction process is to employ a high heat conductive material such as copper and aluminum. However, copper and aluminum are both metal conductors. An LED illuminating device, as an electric appliance, should meet the requirement of safe use of the electricity, so that a predetermined insulating effect should be ensured between the LED node and the radiator (metallic exploded components). A typical insulation requirement is to withstand at least a kilovoltage. Insulation and heat conduction are somewhat incompatible. In a current product, an LED wafer is provided on a ceramic insulation substrate so that high voltage withstanding capability and not low thermal conductivity are made use of so as to solve the problem. The ceramic such as $Al_2O_3$ ceramic material has a thermal conductivity up to 20 W/m·K, but is still 10 times smaller than aluminum and about twenty times smaller than copper. And the heat flux density on the LED wafer is high as $10^6$ $W/m^2$. When a 0.2 mm $Al_2O_3$ insulation substrate is employed, a temperature difference of heat conduction on the insulation substrate amounts to 10° C.

SUMMARY OF THE PRESENT INVENTION

The object of the present invention is focused on in the heat conduction process in the LED heat dissipating process, to solve the heat dissipating problem in the standardization of the lamp core as well as the contradiction between the heat conduction and insulation within the LED chip, so as to provide a technical solution of a simple structure and low cost.

Additional advantages and features of the invention will become apparent from the description which follows, and may be realized by means of the instrumentalities and combinations particular point out in the appended claims.

According to the present invention, the foregoing and other objects and advantages are attained by a LED lamp core mainly consisting of wafers, a heat diffusion plate, and a heat conductive core. The heat produced by the wafers is transferred to the heat conductive core via the heat diffusion plate, and then is transferred from the heat conductive core to the radiator. The present invention has the following characteristics. The heat conductive core comprises aluminum or copper. The heat transferring contact surface (i.e. the heat is transferred outward from the heat conductive core) between the heat conductive core and the radiator employs a taper structure, or screwed-cylinder structure, or taper screwed-cylinder structure. The wafers are soldered and attached on the heat diffusion plate. The area of the heat diffusion plate is more than five times the area of the wafer/wafers. The thickness of the heat diffusion plate is not less than 0.5 mm. And the heat diffusion plate uses copper, or aluminum, or copper-aluminum composite material. A high voltage insulation layer, the thickness of which is larger than 0.1 mm, is provided between the heat diffusion plate and the heat conductive core.

The heat conductive core may employ a taper structure. The radiator is correspondingly provided with mating a taper hole, so that when a relatively small pushing and squeezing force is applied, a contact pressing force which is amplified several times is produced between the taper surface of the heat conductive core and the conical hole surface of the radiator and thus the thermal contact resistance is reduced.

Since the surface area of the screwed-cylinder surface is amplified, the heat transferring contact area is amplified and the thermal contact resistance between the heat conductive core and the radiator is reduced. For example, when a normal 60° triangular screw is introduced, the surface area will be two times of the cylinder surface. The LED lamp core is installed into the radiators (lamp fittings) with a rotation manner, so that no additional tools are required and thus the operation is very convenient.

The advantages of taper screwed-cylinder structure include that of the taper structure and the screwed-cylinder structure: the heat transferring contact area is amplified, the contact pressing force is amplified and the installation is convenient.

The heat conductive core of the present invention solves the heat transferring problem between the LED lamp core and the radiators, and the assembling of the LED lamp core is convenient, so that the primary issue for the realization of the LED lamp core standardization is solved.

The important function of the heat diffusion plate is firstly explicitly pointed out and defined: heat diffusion function (decreasing heat flux density) for a wafer/wafers, in the present invention, and the name is named heat diffusion plate. Due to the small area of the LED wafer such as a wafer of a size of 1×1 mm, even the power is only 1.2 W, the heat flux density amounts to $10^6$ $W/m^2$, this is very high and thus solving the thermal contact resistance between the wafers and the heat diffusion plate becomes a primary issue, and the electrical insulation therebetween is a secondary issue. When employing a soldering technology, the wafers are soldered and attached on the heat diffusion plate through the soldering process, the heat conduction temperature difference between the wafers and the heat diffusion plate can be effectively reduced. As a heat diffusion plate serving to diffuse heat, not only a material of high conductivity is required, the area and the thickness also should be large enough, so the heat diffusion plate is preferred to use copper and aluminum. And the area of the heat diffusion plate should be more than five times the area of the wafer/wafers on the heat diffusion plate, and the thickness thereof should be not less than 0.5 mm. In a practical design, the area of the heat diffusion plate should be equal to or more than ten times the area of the wafer/wafers. If the size of the wafer is 1×1 mm and the power is 1 W, the thickness of the heat diffusion plate should be above 1.0 mm. The object and effect for this are to effectively diffuse heat in the heat diffusion plate and reduce the heat flux density between the heat diffusion plate and the heat conductive core. In order to meet the requirement of the insulation for the safe use of electricity, a high voltage insulation layer is provided between the heat diffusion plate and the heat conductive core In the present invention, the high voltage insulation layer is defined as an insulation layer which can withstand above 500V D.C.

The thickness of the high voltage insulation layer provided between the heat diffusion plate and the heat conductive core is larger than 0.1 mm. When a $Al_2O_3$ ceramic insulation layer with a thickness of 0.1 mm is introduced, it can withstand one kilovoltage D.C. This makes the insulation layer provided between the heat diffusion plate and the heat conductive core take responsibility of most or all of the insulation requirement for the safe use of electricity, so that the insulation requirement between the wafers and the heat diffusion plate is reduced or even the insulation therebetween is not considered at all, so as to reduce the heat transferring temperature difference therebetween.

If tin soldering is used between the wafers and the heat diffusion plate with a thickness of tin therebetween is 20 μm and the heat flux density is $10^6$ W/m$^2$, the heat transferring temperature difference between the two interfaces is calculated and the result is $\Delta t=0.32°$ C. Through the heat diffusion plate, if the heat flux density is reduced eight times to be $1.25\times10^5$ W/m$^2$, the high voltage insulation layer between the heat diffusion plate and the heat conductive core employs a $Al_2O_3$ ceramic with a thickness of 0.2 mm and a heat conductivity of 20 W/m·K, the heat transferring temperature difference at the high voltage insulation layer is calculated and the result is $\Delta t=1.25°$ C. In other words, the sum of the heat transferring temperature difference between the two interfaces is within 2° C.

If a $Al_2O_3$ ceramic insulation plate with a thickness of 0.2 mm is provided between the wafer and the heat diffusion plate (heat sink) according to a structure of a product of the state of the art, the heat transferring temperature difference of the two sides of the ceramic plate is calculated and the result is $\Delta t=10°$ C. which is five times larger than the above value.

It can be seen that the heat transferring temperature difference in the LED lamp core is significantly reduced with the present invention. In the following detailed description of the preferred embodiments, the advantages of the LED lamp core of the present invention such as convenient for water-proof, mass production, and standardization will be described in details.

For the LED chip component consisting of wafers and a heat diffusion plate, a detailed structure and manufacturing method is provided from the perspective of reducing heat conduction resistance, bringing down the costs, and facilitating the manufacturing process.

Firstly, the heat diffusion plate uses aluminum, or copper, or copper-aluminum composite material. The soldering contact area between the wafer and the heat diffusion plate is larger than one third of the area of the wafer. The heat diffusion plate is provided with a high voltage insulation layer, or a low voltage insulation layer.

Secondly, the pn junction electrode of the wafer is a V type electrode. A flip chip structure is used. The heat diffusion plate uses aluminum, or copper, or copper-aluminum composite material. The wafer is provided with heat conduction solder pad. The soldering contact area between the wafer and the heat diffusion plate is larger than one third of the area of the wafer. The outside of the n-electrode, and the p-electrode or part of the p-electrode of the wafer is covered by a layer of ceramic insulation membrane generated through vapor deposition. The heat conduction solder pad is provided at the outside of the ceramic insulation membrane.

Thirdly, a wafer locating plate of insulation material is introduced into the LED chip. The wafer locating plate is soldered or adhered and attached on the heat diffusion plate. The wafer is embedded into the wafer locating and embedding opening of the wafer locating plate while the wafer is soldered and attached on the heat diffusion plate.

Fourth, a manufacturing and packaging method of the LED chip characterized in that: a wafer locating board which is provided with a plurality of wafer locating and embedding openings and at least two retaining holes are introduced. The heat diffusion board is provided with corresponding solder pads and locating holes. The wafers are firstly embedded and fixed on the wafer locating board and are retained in position by the retaining holes, and then together with wafer locating plate are attached to the heat diffusion board and heated to finish the soldering procedure between the wafer and the heat diffusion plate. Alternatively, the wafer locating plate is attached and fixed on the heat diffusion board first, and then the wafers are embedded into the wafer locating and embedding openings, and then heating to finish the soldering procedure between the wafer and the heat diffusion plate.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 11 is a schematic view of the features of the wafer of the chip in FIG. 10 illustrating the p-electrode, the n-electrode and solder pads thereof, the ceramic insulation membrane, and the heat conduction solder pad, wherein the n solder pad is illustrated at four corners.

FIG. 12 is a schematic view of the ceramic insulation membrane and heat conduction solder pad in FIG. 11.

FIG. 13 is a sectional view illustrating features of an LED chip of the present invention.

FIG. 14 a schematic views of the wafer of the chip in FIG. 13, wherein the p-electrode, the n-electrode and solder pads thereof, the ceramic insulation membrane, the heat conduction solder pad are illustrated.

FIG. 15 a schematic view of the ceramic insulation membrane and heat conduction solder pad in FIG. 14.

FIGS. 16 and 17 are schematic views illustrating the features when a wafer locating board of the present invention is used to ensure the mating soldering between the wafer and the heat diffusion board, wherein FIG. 17 is a sectional view illustrating the features in FIG. 16.

Wherein in the Figs:

1 wafer; 2 heat diffusion plate; 3 radiator;

4 high voltage insulation layer; 5 screw; 6 heat conductive core;

7 fin; 8 low voltage insulation layer; 9 leading wire;

10 sealing glue; 11 PCB board; 12 lamp housing; 13 contact spot;

14 resilient contact terminal; 15 substrate; 16 heat conduction solder pad 17 n solder pad; 18 n leading wire; 19 electrode leading wire insulation layer;

20 p-electrode; 21 ceramic insulation membrane; 22 n-electrode;

23 p solder pad; 24 p leading wire; 25 wafer locating board;

26 retaining hole; 27 heat diffusion board; 28 wafer locating plate;

29 conduction wire; 30 soldering flux.

DETAILED DESCRIPTION OF THE PREFERRED EMBODIMENT

Figure 1:
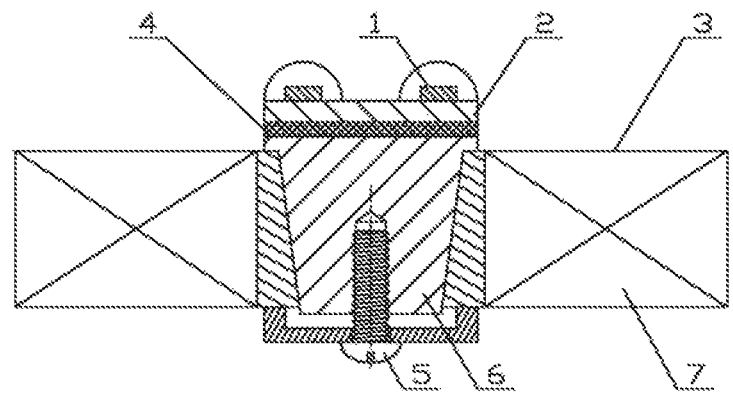
FIG. 1 is a sectional view illustrating the features of an LED lamp core of the present invention equipped with a radiator having a heat conductive core of a taper structure, wherein the coupling relation between the lamp core and the radiator is illustrated.

Referring to FIG. 1, a heat conductive core 6 employs a taper structure. The taper column surface (i.e. the exterior heat transferring surface of the heat conductive core) is firmly contacted with central conical hole of a radiator 3. Heat is transferred from the heat conductive core 6 to the radiator 3 via the contact surfaces, so that the gap between the contact surfaces should be as small as possible. In the taper column and conical hole, a relatively small pushing and squeezing force will result in an above ten times amplified contact pressing force. In FIG. 1, a screw 5 is used to apply pulling force so that the heat conductive core 6 is firmly retained in the central conical hole of the radiator 3. In order to further reduce the thermal contact resistance between the heat conductive core and the radiator, a heat conduction paste such as silicone grease should be coated on the cylinder surface.

As illustrated in FIG. 1, a single heat diffusion plate 2, a plurality of wafers are provided (soldered) on the heat diffusion plate 2. The heat diffusion plate 2 is attached to an end surface of the heat conductive core 6 via a high voltage insulation layer 4. The end surface is called heat absorption surface. Another end opposite to this end, which is provided with screw 5, is called rear end of the heat conductive core. The surface of the heat diffusion plate which is closely attached to the heat absorption surface of the heat conductive core is called surface B of the heat diffusion plate while another surface which is provided with wafers is called surface A of the heat diffusion plate.

An anodization process, in which aluminum oxide membrane is grown on the aluminum metal surface of the heat conductive core or the heat diffusion plate to serve as the high voltage insulation layer, the problem of the thermal contact resistance between the high voltage insulation layer and the heat diffusion plate as well as the heat conductive core is solved. The anodization process is of low costs and high efficiency, thus is suitable for mass production.

Figure 2:
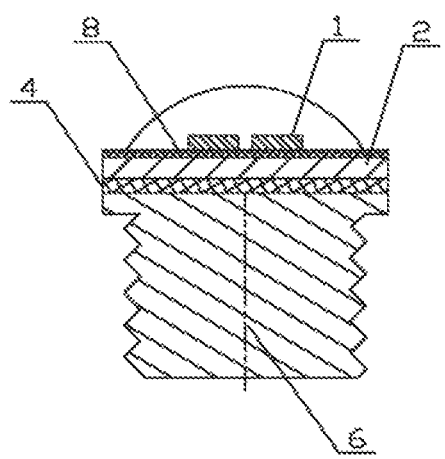
FIG. 2 is a sectional view illustrating the features of an LED lamp core of the present invention with a heat conductive core of a screwed-cylinder structure.

In the LED lamp core of FIG. 2, the heat conductive core 6 uses a screwed-cylinder structure. A single heat diffusion plate structure is also incorporated. But the wafers 1 are centralizedly provided at the center of the heat diffusion plate 2, and the surface A of the heat diffusion plate 2 is provided with a low voltage insulation layer 8, and the wafers 1 are provided (soldered) on the low voltage insulation layer 8. The insulation layer enables a circuit, and solder pads and electrode leading wires corresponding to the wafers to be provided on the surface A of the heat diffusion plate as well as other auxiliary components (such as Electro-Static Discharge protect component) together with the wafers are provided on the heat diffusion plate. This structure is of high integrality and is convenient for downstream production.

Since the heat flux density of the wafers is relatively high, reducing the heat conduction resistance of the low voltage insulation layer becomes significantly important. The insulating intensity is not so important for it just needs to reach the maximum voltage without need to meet the requirement of safe use of electricity. A peak voltage of 220V commercial power is 380V. In other words, the insulating intensity of the low voltage insulation layer 8 can be enough if the maximum intensity reaches 450V, it is defined as low voltage insulation and so called low voltage insulation layer.

A ceramic membrane prepared through vapor deposition such as diamond, SiC, AlN, BN, BeO, Al2O3, and etc. is advantageous for good insulation and heat conductivity. Especially, diamond, SiC, AlN, BN and BeO, which are high heat conductive ceramic, not only are suitable to be used as the low voltage insulation layer on the surface A of the heat diffusion plate, but also more suitable to be used as ceramic insulation membrane on the wafers which will be described in detail in the following disclosure. The vapor deposition process includes physical vapor deposition (PVD) and chemical vapor deposition (CVD) which are both suitable for manufacturing the low voltage insulation layer of the present invention.

Aluminum anodization process also can be used to prepare the low voltage insulation layer on the surface A of the heat diffusion plate. Although the heat conductivity of the resulting aluminum oxide membrane is not high as the ceramic membrane prepared by vapor deposition, the costs are relatively low and a thicker membrane is easy to obtain, and the insulating intensity can reach above 100V. When in a design, the thickness of the aluminum oxide membrane of the low voltage insulation layer is smaller than 50 μm so that the heat conduction resistance is controlled.

Although copper is more expensive than aluminum, few materials of heat diffusion plate need to be used. And more importantly, because the heat flux density of the wafers is very high, so a high heat conductivity material is more important. So copper is preferred for the heat diffusion plate. If an aluminum oxide insulation layer with anodization is required to be formed on the surface of a copper heat diffusion plate, a copper-aluminum composite material can be used. Accordingly, an aluminum layer can be coated on the surface of a copper plate. The thickness of the aluminum layer on the surface A of the heat diffusion plate should be small enough as long as it reaches the required aluminum thickness which is enough for anodization.

Figure 3:
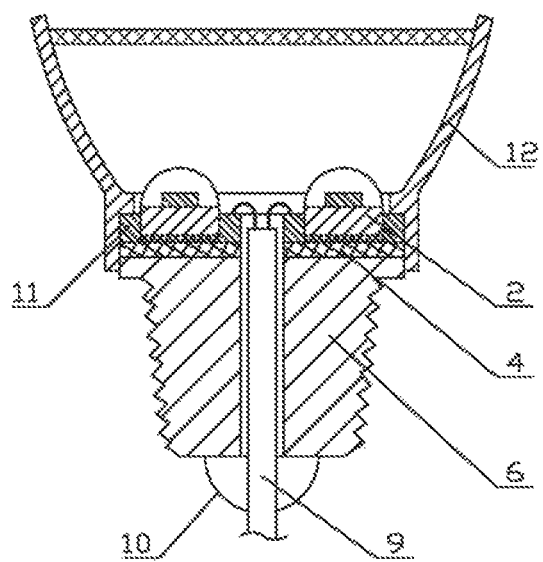
FIG. 3 is a sectional view illustrating the features of an LED lamp core of the present invention with a heat conductive core of a taper screwed-cylinder structure, wherein a lamp housing is also equipped, wherein the features of the structure of the leading wire and measurement for achieving waterproof effect are also illustrated.

FIG. 3 illustrates an LED lamp core of the present invention, wherein the heat conductive core 6 employs a screwed-cylinder structure, a lamp housing 12 is also equipped. A leading wire 9 penetrates the heat conductive core 6 and is guided out from the rear side of the heat conductive core. As shown in FIG. 3, sealing glue 10 is provided on rear side of the heat conductive core at the out guiding position of the leading wire 9, so that a reliable water-proof of the out guiding position of the leading wire 9 is achieved. The water-proof of the front side of the lamp core may be achieved via the lamp housing 12 as well as potting with sealing glue.

As shown in FIG. 3, each wafer is equipped with a heat diffusion plate to form a structure of multiple LED chips. In addition, the high voltage insulation layers 4 are not only proved on the heat absorption surface of the heat conductive core 6, but also are provided on the surface B of the heat diffusion plate 2, so that a single LED chip will have a high voltage insulation characteristic. A PCB board 11 is also illustrated in FIG. 3, the LED chips are embedded into the PCB board 11. The auxiliary circuit of the LED chip can be provided on the PCB board 11 and the leading wire 9 can also be soldered with the circuit on the PCB board 11.

In FIG. 3, the electrical connection between the lamp core and an external power source can employ the leading wires, but connecting wire terminals, contact spots, or contact discs also be used. The connecting wire terminals, contact spots (contact discs) are provided at the rear side of the heat conductive core. Connecting wires (leading wire 9) penetrate the heat conductive core. In other words, the connecting wires are hidden within the heat conductive core. The LED lamp core illustrated in FIG. 4 uses the structure of contact spots. The contact spots 13 on the lamp core contact with the resilient contact terminal 14 fixed on the radiator 3, the structure is similar to the structure of a current light bulb.

Figure 5:
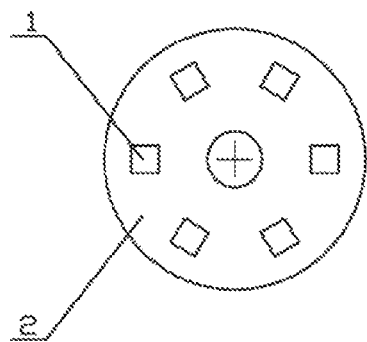
FIGS. 5 and 6 are schematic views illustrating the wafer distribution of the LED lamp core, wherein the wafers or wafer group are arranged to be radially dispersed and are dispersed as even as possible.
Figure 6:
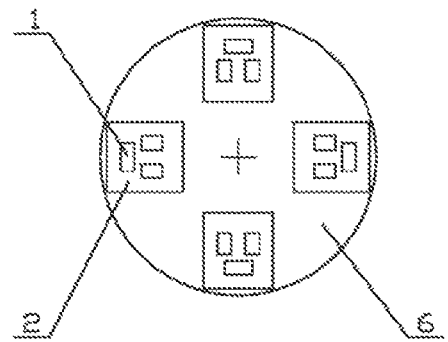

In order to reduce the heat conduction resistance, the arrangement of LED wafers on the heat diffusion plate, or the LED chip consisting of wafers and heat diffusion plates on the heat conductive core should be dispersedly configured as dispersive as possible. The power of a single wafer should be as small as possible but the numbers of the wafers should be as many as possible. FIG. 5 illustrates a dispersive configuration of six wafers on a heat diffusion plate. FIG. 6 illustrates four chips are dispersedly provided on the heat conductive core 6, each chip is a chip group consisting of three wafers. In the design of the LED lamp core, the numbers of the wafers or the wafer group should be as many as possible and should be not less than three, but a too large number may result in high manufacturing costs. The power of a single wafer should be as small as possible, the maxim power should be not more than 4 W. But a too small power of the single wafer also means that the numbers of the wafers should be increased and thus may result in high costs. The wafers or wafer groups (chips) in FIG. 5 and FIG. 6 are all radially dispersed. This kind of dispersive configuration is desirable.

Figure 7:
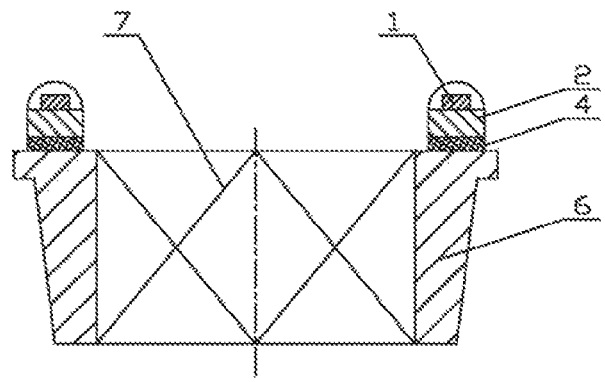
FIG. 7 is a sectional view illustrating the features of an LED lamp core of a high power of the present invention, wherein a middle hollow structure is provided for installation of fins.

In the LED lamp core illustrated in FIG. 7, the heat conductive core has a middle hollow structure and is provided with fin 7. Such a configuration is designed for an LED lamp core of a high power. Because the higher the power of the LED lamp core, the more the number of the wafers or the chips. In addition, the wafers and the chips should be radially and dispersedly provided, so that the outer diameter of the heat conductive core is extremely large. The central portion is a hollow structure that can be used for installing fins.

Figure 4:
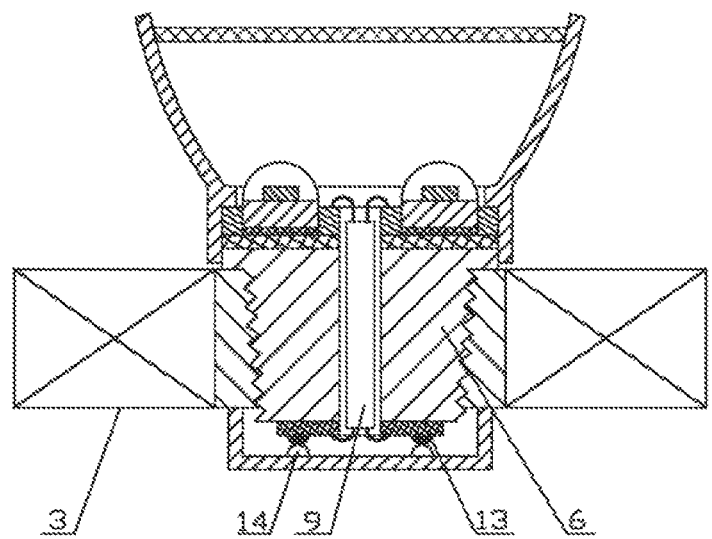
FIG. 4 is a sectional view illustrating the features of an LED lamp core of the present invention, wherein the electrical connection employing a structure of resilient contact terminals or contact spots between the lamp core and the lamp fitting (radiator) is illustrated.

In the LED lamp core illustrated in FIGS. 3, 4, and 7, the high voltage insulation layer 4 is provided on the surface B of the heat diffusion plate 2. If the high voltage insulation layer is formed from oxidation of aluminum anode, a copper-aluminum composite material is preferred for the heat diffusion plate 2. According to the present invention, the soldering contact area between the wafer and the heat diffusion plate should not be less than one third of the area of the wafer. In addition, the area of the heat diffusion plate should be more than five times (preferably not less than ten times) the area of the wafer while the thickness thereof is not less than 0.5 mm.

Figure 8:
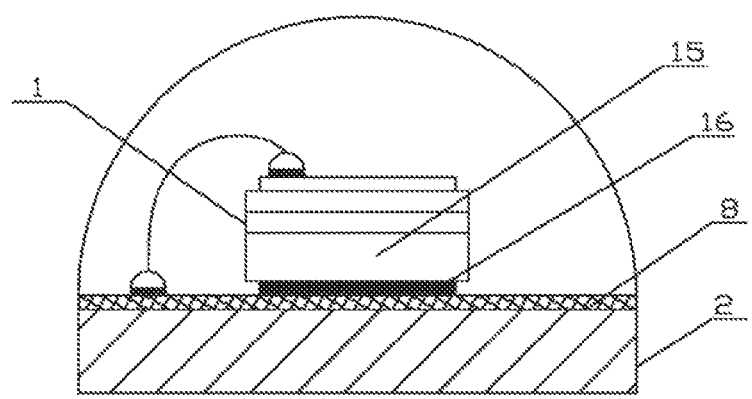
FIGS. 8 and 9 are sectional views illustrating the features of two kinds of LED chip of the present invention, wherein the pn junction is an L type electrode which is particularly suitable for the wafer with carborundum substrate.
Figure 9:
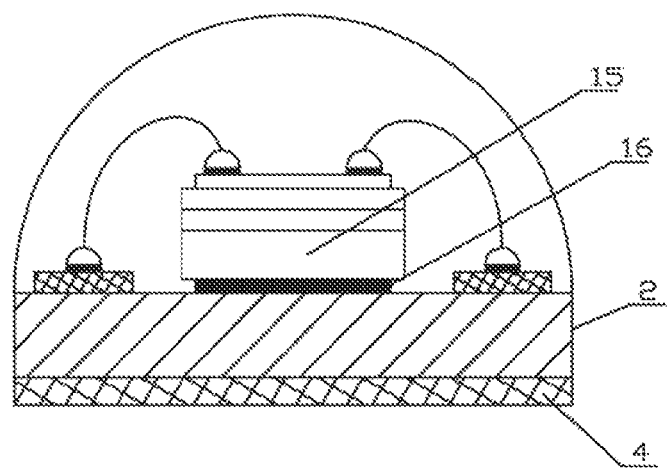

In the LED chip illustrated in FIG. 8, the pn junction electrode employs an L contact (Lateral-Contact) which is called L type electrode for short. LED wafer with carbonrundum substrate is suitable for employing this kind of electrode because SiC can form an conductor through doping. The carbonrundum substrate can be used as an n-electrode. The outer surface of the substrate 15 is provided with a heat conduction solder pad 16, i.e. n-solder pad. A low voltage insulation layer 8, which can be formed through vapor deposition or aluminum anodization, is provided on the surface B of the heat diffusion plate 2 illustrated in FIG. 8. Corresponding heat conduction solder pads (i.e. n leading wire solder pad) and n leading wires are provided on the surface of the low voltage insulation layer 8, the LED wafer is soldered and attached on the low voltage insulation layer 8. The LED chip illustrated in FIG. 9 is similar with the LED chip illustrated in FIG. 8, the main difference is that the heat conduction solder pad 16 on the substrate 15 is directly soldered with the metal on the heat diffusion plate 2 and the surface B of the heat diffusion plate 2 is provided with a high voltage insulation layer 4.

Figure 10:
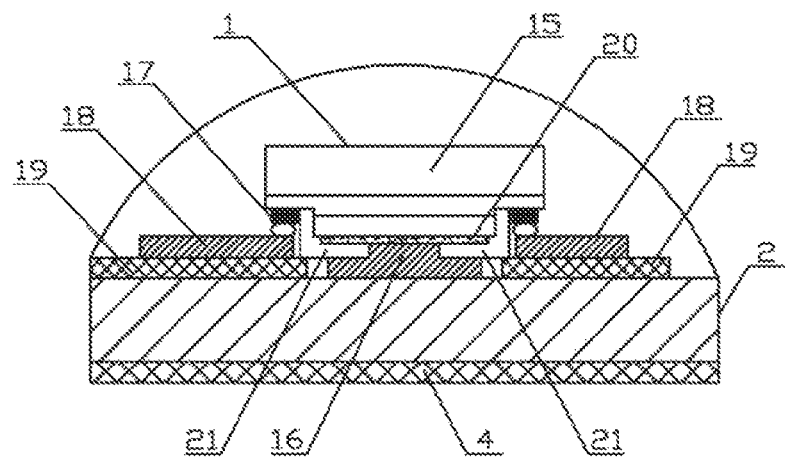
FIG. 10 is a sectional view illustrating the features of an LED chip of the present invention, wherein the pn junction is a V type electrode, wherein the chip has a flip chip structure in which the heat conduction solder pad is integrally formed with the p solder pad so that the chip is particularly suitable for wafers with sapphire substrates.

In the LED chip illustrated in FIG. 10, the pn junction electrode employs a V contact (Vertical-Contact) which is called V type electrode for short. And a flip chip structure is used. The LED wafer with sapphire substrate is suitable for this kind of structure. As shown in the Fig, the heat conduction solder pad 16 on the substrate 15 is directly soldered with the metal on the heat diffusion plate 2. The heat conduction solder pad 16, which serves as the p solder pad, is communicated with the p-electrode 20. A ceramic insulation membrane 21 prepared through vapor deposition is provided between the heat conduction solder pad 16 and the p-electrode 20. The heat diffusion plate 2 severs as a p leading wire. The p pins of the chip can be directly soldered with the heat diffusion plate 2. The surface B of the heat diffusion plate 2 is provided with a high voltage insulation layer 4. The surface A of the heat diffusion plate 2 is provided with a n leading wire 18, a electrode leading wire insulation layer 19 is provided therebetween. The n leading wire 18 is provided with solder pads which can be directly soldered with the n solder pads 17 on the wafers 1. The soldering contact area between the wafer 1 and the heat diffusion plate 2 comprises the area of the heat conduction solder pad 16 and the area of the n solder pad. If the area of the heat conduction solder pad 16 is large enough, the issue of the heat conduction resistance of the electrode leading wire insulation layer 19 is not so important. As illustrated in FIGS. 11 and 12, the n-electrode 22 and part of the p-electrode 20 are covered by the ceramic insulation membrane 21. The heat conduction solder pad 16 is provided at the outer side of the ceramic insulation membrane 21. The objective of using such a structure of the ceramic insulation membrane 21 is to increase the area of the heat conduction solder pad (i.e. the soldering contact area between the wafer and the heat diffusion plate) to be as large as possible.

The LED chip illustrated in FIG. 13 is similar to the LED chip illustrated in FIG. 10 with a V type electrode, and a flip chip structure. The difference is that all of the n-electrode 22 and the p-electrode 20 (except the solder pads) are covered by the ceramic insulation membrane 21, and the heat conduction solder pad 16 is spaced apart from the p solder pad 23 and is spaced apart from the two electrodes, as shown in FIGS. 14 and 15. The surface A of the heat diffusion plate 2 is further provided with p leading wire 24 which is separated by the electrode leading wire insulation layer 19.

An LED wafer of 1×1 mm is a wafer of large size. Such a small area is provided with electrode solder pads and the heat conduction solder pad, as shown in FIGS. 11 and 14, the size of the electrode solder pad is generally as small as having a diameter of 0.1 mm. In addition, inexistence of a shortcircuit soldering should be guaranteed, so that a mating accuracy between the wafer and the heat diffusion plate is really high. An eutectic welding with a few seconds of heating is a typical solution. If the wafers are positioned and mated one by one before heating and soldering, the requirement of the equipments is high and also is expensive, the efficiency is also low. The low efficiency and high costs of the package of the LED chip of a high power are also issues of the current LED industry.

Figure 16:
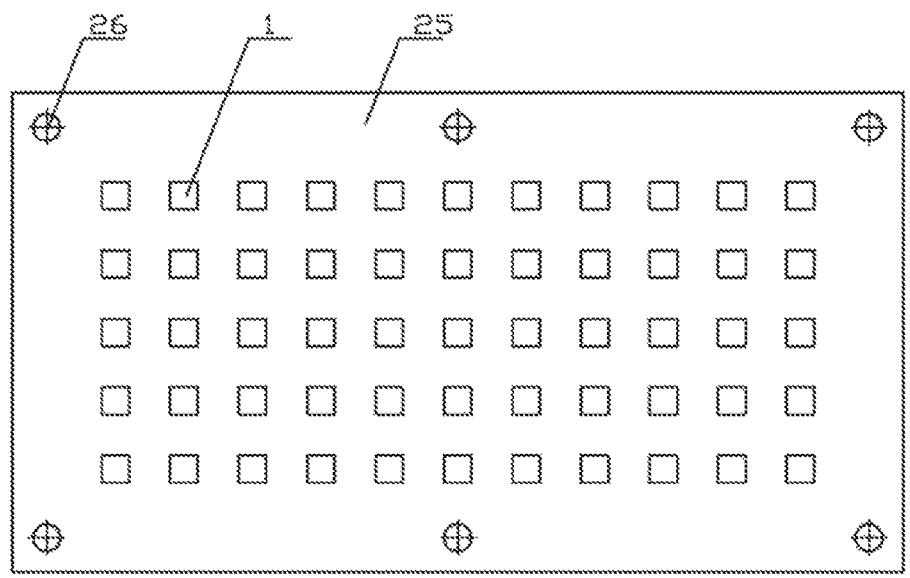
Figure 17:
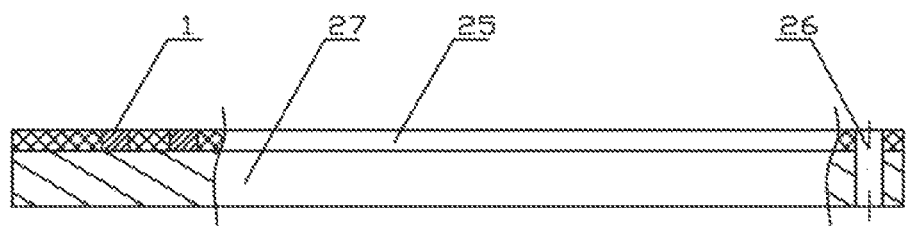

The present provides a wafer locating plate to solve the above mentioned problem, as shown in FIGS. 16 and 17, a plurality of wafer locating and embedding openings are provided in a wafer locating board 25. A wafer 1 is embedded in the wafer locating and embedding opening. The wafer locating board 25 is further provided with retaining holes 26.

Figure 19:
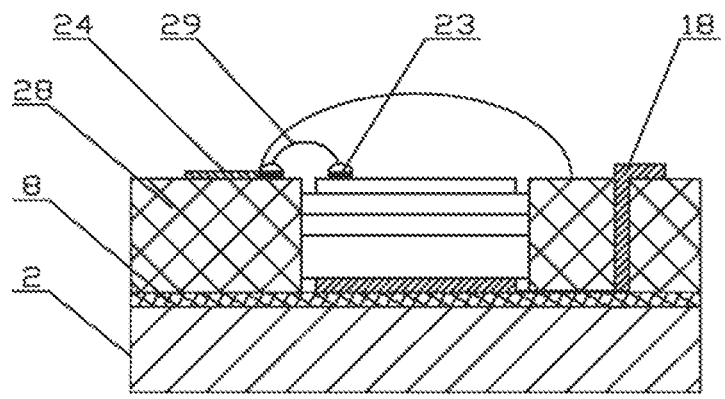
FIGS. 19 and 20 are schematic views respectively illustrating two kinds of LED chip of the present invention with wafer locating plate, wherein the pn junction electrode is an L type electrode and the LED chips are suitable for the wafer with carborundum substrate.
Figure 20:
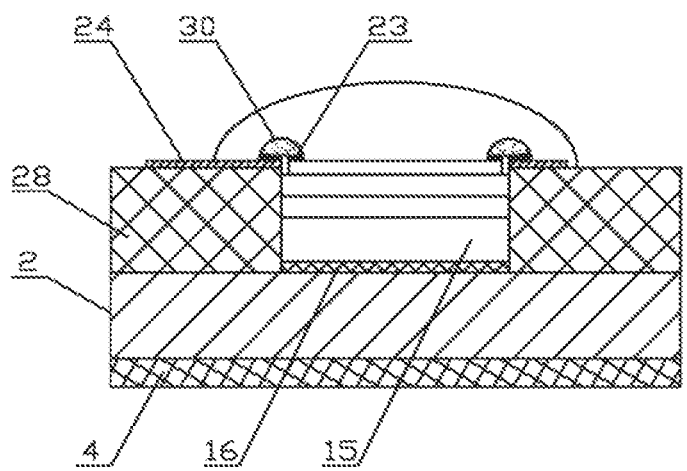

Six retaining holes 26 are illustrated in the drawings. At least two retaining holes 26 should be provided when in a practical design. A punching process, which has a high accuracy, a simple equipment, and high efficiency, is used for forming the retaining holes 26 and the wafer locating and embedding openings. The heat diffusion board 27 is provided with corresponding retaining holes and solder pads with respect to the wafers based on the positions of the retaining holes. The position of the wafer is determined by the wafer locating and embedding opening in the wafer locating board 25. The mating between the wafer locating board 25 and the heat diffusion board 27 is determined by the retaining holes 26, so that the mating accuracy between the solder pad on each wafer and corresponding solder pad on the heat diffusion board is ensured. The whole piece is then heated and soldered so as to complete the soldering of a plurality of wafers (55 wafers in the drawings) at a time. This process not only has a high efficiency, but also is advantageous for its simple equipments. During heating and soldering, a pressing is required so that the wafer is pressed to be attached on the heat diffusion plate and thus the quality of the soldering is ensured. Since the wafer is embedded into the wafer locating and embedding opening, so that it is easy to guarantee that the wafer will not move during pressing. This step can be carried out with the following two manners. (1), the wafers 1 are firstly embedded and fixed on the wafer locating board 25, then together with wafer locating board 25 are attached to the heat diffusion board 27 and then heated to finish the soldering procedure between the wafer and the heat diffusion plate. (2), the wafer locating board 25 is retained in position by the retaining holes and then is attached and fixed on the heat diffusion board 27, and then the wafers 1 are embedded and fixed on the wafer locating board 25, and then heating to finish the soldering procedure between the wafer and the heat diffusion plate. After the soldering procedure, the wafer locating board 25 can be removed, but also can be remained. Referring to FIGS. 19 and 20, the wafer locating board cut and remained in the LED chip is called wafer locating plate. In this respect, the wafer locating plate should be made of insulation material such as polyester membrane plate which can endure a relatively high temperature.

Figure 18:
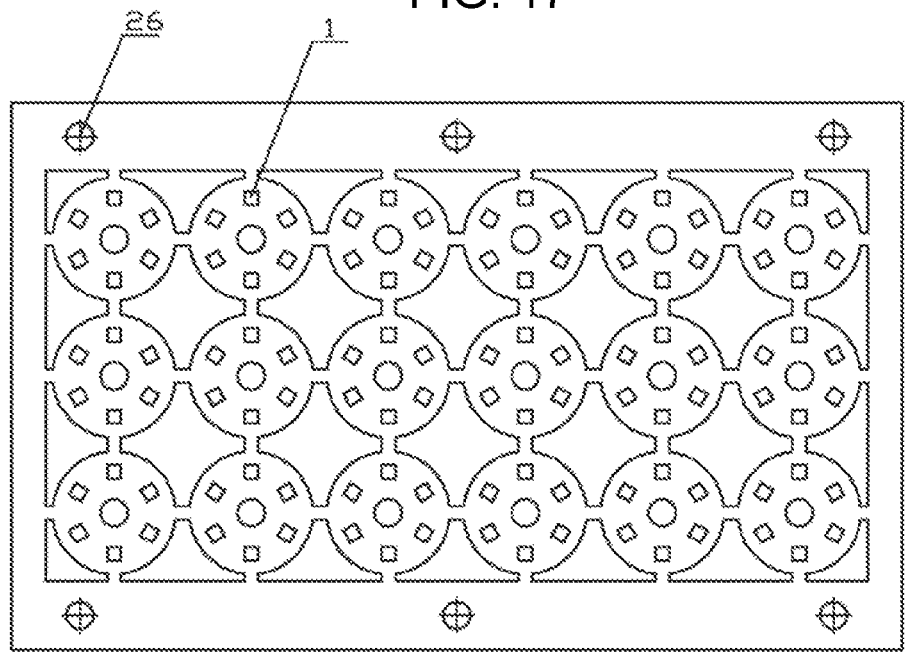
FIG. 18 is a schematic view illustrating the features when a wafer locating board of the present invention is used to ensure the mating soldering between the wafer and the heat diffusion board.

As illustrated in FIG. 18, the above mentioned process is used to manufacturing the LED chip (as shown in FIG. 5) with a structure of a single heat diffusion plate and multiple wafers. A wafer locating board and a heat diffusion board are respectively provided with many wafer locating plates and heat diffusion plates which are connected together and arranged in lines. When the mating soldering and the potting with sealing glue are finished, the connecting portions are cut so that the LED chips are formed one by one.

FIG. 19 illustrates an LED chip with a wafer locating plate. The wafer locating plate 28 is provided with electrode leading wires and solder pads (or circuit). The wafer in FIG. 19 uses an L type electrode. The heat conduction solder pad 16 is the n solder pad. The n leading wire 18 penetrates the wafer locating plate 28 and gets out from the top thereof. The wafer locating plate 28 is provided with p leading wire 24. The p solder pad 23 on the wafer and the solder pad on the p leading wire 24 are connected by conduction wire 29.

In the LED chip illustrated in FIG. 20, the electrode solder pad (p solder pad 23) on the wafer is adjacent to an edge of the wafer (preferably provided at a corner thereof). The solder pad of the electrode leading wire (p leading wire 24) on the wafer locating plate 28 is closely adjacent to the corresponding solder pad (p solder pad) on the wafer. The two electrode solder pads are directly soldered and communicated by soldering fluxes 30 (such as tin).

Figure 21:
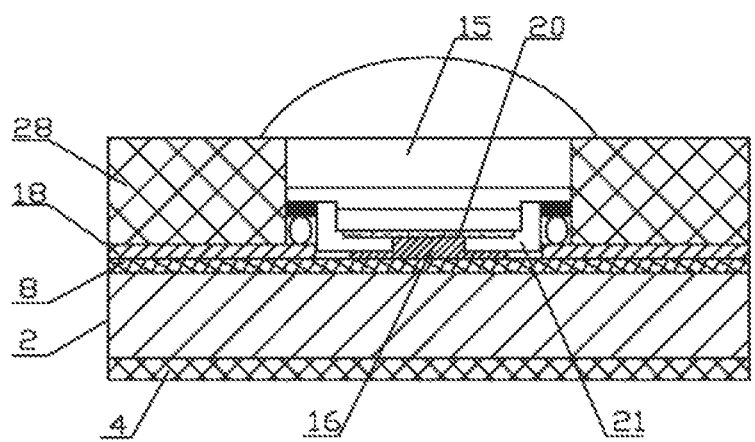
FIGS. 21, 22 and 23 are schematic views respectively illustrating three kinds of LED chip of the present invention with wafer locating plate, wherein the pn junction electrode is an L type electrode and the LED chips have flip chip structures.
Figure 22:
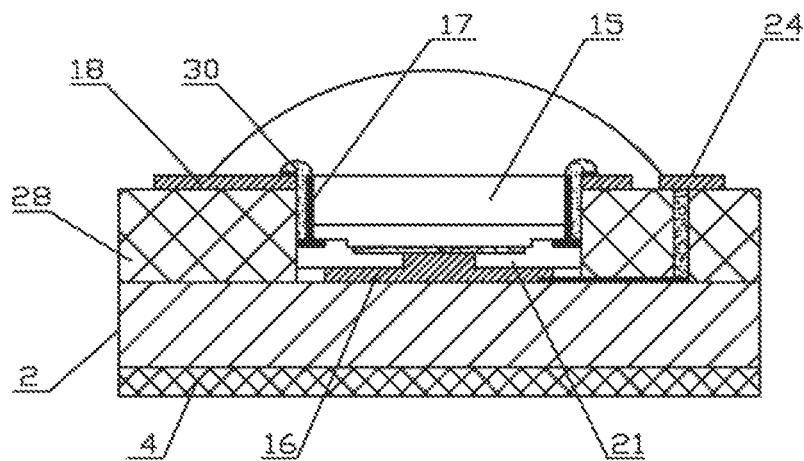

In the LED chip with a wafer locating plate illustrated in FIG. 21, a V type electrode and a flip chip structure are employed. The surface A of the heat diffusion plate 2 is provided with a low voltage insulation layer 8 while the surface B thereof is provided with a high voltage insulation layer 4. The low voltage insulation layer 8 is provided with an electrode leading wire (n leading wire 18, p leading wire is not illustrated in the drawings), and heat conduction solder pad (p leading wire solder pad). The LED chip illustrated in FIG. 22, which is similar with the LED chip illustrated in FIG. 21, also uses a V type electrode and a flip chip structure. The obvious difference is that n solder pad 17 is provided on the side wall of the wafer, the solder pad of the n leading wire 18 on the wafer locating plate 28 is closely adjacent to the corresponding solder pad (n solder pad 17) on the side wall of the wafer. The two electrode solder pads are directly soldered and communicated by soldering fluxes 30.

Figure 23:
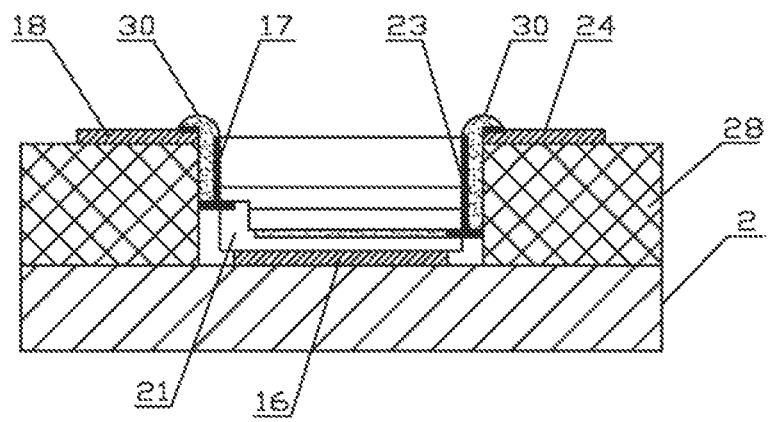
Figure 24:
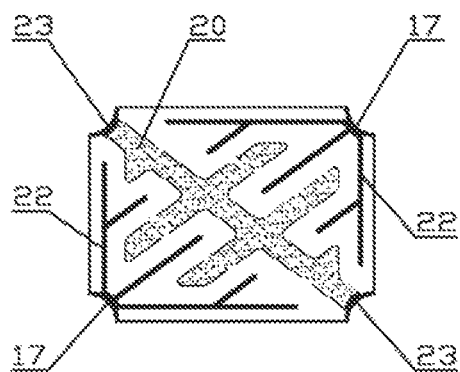
FIG. 24 is a schematic view illustrating features of the chip in FIG. 23.

In the LED chip illustrated in FIGS. 23 and 24, the four corners of the wafer are cut off to form a one-quarter segment of a circle respectively. The n solder pad 17 and p solder pad 23 are provided in the side walls of the four unfilled corners and are arranged with diagonal distribution, the solder pad of the leading wire on the wafer locating plate 28 is closely adjacent to the solder pad on the side wall of the wafer. The two electrode solder pads are directly soldered and communicated by soldering fluxes 30. The ceramic insulation membrane 21 covers an integral surface of the wafer. The heat conduction solder pad 16 is apart from the two electrodes. The heat diffusion plate 2 is a pure metal board plate. The heat conduction solder pad 16 on the wafer is directly soldered with the metal on the heat diffusion plate 2. Such a structure is beneficial for increasing the area of the heat conduction solder pad (soldering contact area) as well as reducing the requirement of mating accuracy.

As illustrated in FIGS. 11, 14 and 24, the electrode solder pads are all provided at the corners, also can be provided adjacent to the edge of the wafer. But installing at the corners is more beneficial for making use of the wafer area to obtain more illuminating areas. The n and p solder pads illustrated in FIGS. 14 and 24 are all provided at the corners with diagonal distribution configuration.

In order to enhance the light extracting rate, a light reflective membrane should be provided on the outer surface of the wafer locating plate for reflecting out the light reflected to the surface of wafer locating plate.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A LED lamp core comprising a heat conductive core (6) with a heat absorption surface and a heat transferring contact surface, a high voltage insulation layer (4), a wafer or a plurality of wafers (1), a wafer locating plate (28) and a heat diffusion plate (2) consisting essentially of copper, or aluminum, or copper-aluminum composite material and having a surface A and a surface B for the high voltage insulation layer (4) to be attached to, the heat conductive core (6) is a metal part that, the high voltage insulation layer (4) is attached to the heat absorption surface and heat produced by said wafer/wafers is essentially transferred through the heat absorption surface, and heat from said wafer/wafers is transferred outward essentially through the heat transferring contact surface, the high voltage insulation layer (4) is an insulation layer that, the thickness is more than 0.1 mm, is attached directly on and covers said surface B of the heat diffusion plate (2), and is set between the heat diffusion plate (2) and the heat conductive core (6), and is attached on the heat absorption surface of the heat conductive core (6), the heat diffusion plate (2) is a plate that, the area of the heat diffusion plate (2) is more than five times the area of the wafer/wafers on the heat diffusion plate (2), and said wafer/wafers are attached directly on said surface A, or said surface A is provided with a low voltage insulation layer (8), said wafer/wafers are attached directly on the low voltage insulation layer (8), the low voltage insulation layer (8) is an insulation layer that, the thickness is less than 50 µm, is in company with the high voltage insulation layer (4), is set directly on said surface A of the heat diffusion plate (2) and said wafer/wafers are attached directly on, the wafer locating plate (28) is a plate that, there are one or more wafer locating and embedding openings for said wafer/wafers to be embedded into, the size of said wafer locating and embedding opening matches that of said wafer/wafers and the position of the corner of said wafer/wafers relative to the heat diffusion plate (2) is fixed by said wafer locating and embedding openings, characterized in that:

wherein the wafer locating plate (28), which is made of insulation material, is soldered or adhered on said surface A of the heat diffusion plate (2), said wafer/wafers are embedded within said wafer locating and embedding openings.

2. The LED lamp core according to claim 1, characterized in that the wafer locating plate (28) is provided with an electrode leading wire and a solder pad, there is an electrical connection between said solder pad on the wafer locating plate (28) and an electrode solder pad on said wafer/wafers.

3. The LED lamp core according to claim 2, characterized in that: said solder pad on the wafer locating plate (28) and the electrode solder pad on said wafer/wafers are directly soldered together and communicate through the soldering flux (30).

4. The LED lamp core according to claim 1, characterized in that: the thickness of the heat diffusion plate (2) is not less than 0.5 mm.

5. The LED lamp core according to claim 1, characterized in that: the heat transferring contact surface of the heat conductive core (6) for transferring heat outward employs a taper structure, or taper screwed-cylinder structure.

6. The LED lamp core according to claim 1, characterized in that the high voltage insulation layer (4) comprises an aluminum oxide membrane which is directly grown on the metal aluminum surface of the heat conductive core (6) or the heat diffusion plate (2), or both of the heat conductive core (6) and the heat diffusion plate (2) through an anodization process.

7. The LED lamp core according to claim 1, characterized in that: when said surface A is provided with a low voltage insulation layer (8), the low voltage insulation layer (8) employs a ceramic insulation membrane formed through vapor deposition, or an aluminum oxide membrane which is directly grown on the metal aluminum of said surface A of the heat diffusion plate (2) through an anodization process.

8. The LED lamp core according to claim 1, characterized in that: a leading wire (9) is penetrated through both the heat conductive core (6) and the high voltage insulation layer (4).

9. A LED chip comprising a wafer or a plurality of wafers (1), a wafer locating plate (28) and a heat diffusion plate (2) consisting essentially of copper, or aluminum, or copper-aluminum composite material and having a surface A and a surface B for a high voltage insulation layer (4) with thickness of more than 0.1 mm to be attached to,
the heat diffusion plate (2) is a plate that, the area of the heat diffusion plate (2) is more than five times the area of the wafer/wafers on the heat diffusion plate (2), and said wafer/wafers are attached directly on said surface A, or
said surface A is provided with a low voltage insulation layer (8), said wafer/wafers are attached directly on the low voltage insulation layer (8),
the low voltage insulation layer (8) is an insulation layer that, the thickness is less than 50 μm, is in company with the high voltage insulation layer (4), is set directly on said surface A of the heat diffusion plate (2) and said wafer/wafers are attached directly on,
the wafer locating plate (28) is a plate that, there are one or more wafer locating and embedding openings for said wafer to be embedded into, the size of said wafer locating and embedding opening matches that of said wafer/wafers and the position of the corner of said wafer/wafers relative to the heat diffusion plate (2) is fixed by said wafer locating and embedding openings, characterized in that:
wherein the wafer locating plate (28), which is made of insulation materiel, is soldered or adhered on said surface A of the heat diffusion plate (2), said wafer/wafers are embedded within said wafer locating and embedding openings.

10. The LED chip according to claim 9, characterized in that: the thickness of the heat diffusion plate (2) is not less than 0.5 mm.

11. The LED chip according to claim 9, characterized in that: when said surface A is provided with a low voltage insulation layer (8), the low voltage insulation layer (8) employs a ceramic insulation membrane formed through vapor deposition, or an aluminum oxide membrane which is directly grown on the metal aluminum of said surface A of the heat diffusion plate (2) through an anodization process.

12. The LED chip according to claim 9, characterized in that: a pn function electrode of the wafer (1) is a V type electrode, and a flip chip structure is used, wherein the wafer (1) is provided with a heat conduction solder pad (16), wherein a soldering contact area between the wafer (1) and the heat diffusion plate (2) is larger than one third of the area of the wafer (1), wherein the outsides of a n-electrode (22), and a p-electrode (20) or part of the p-electrode (20) of the wafer are covered by a layer of ceramic insulation membrane (21) generated through vapor deposition, wherein the heat conduction solder pad (16) is provided at an outside of the ceramic insulation membrane (21).

13. The LED chip according to claim 9, characterized in that: the wafer locating plate (28) is provided with an electrode leading wire and a solder pad, there is an electrical connection between said solder pad on the wafer locating plate (28) and an electrode solder pad on said wafer/wafers.

14. The LED chip according to claim 13, characterized in that: said solder pad on the wafer locating plate (28) and the electrode solder pad on said wafer/wafers are directly soldered together and communicate through merely the soldering flux (30).

15. The LED chip according to claim 13, characterized in that: an electrode solder pad is provided adjacent to an edge or on a side wall of said wafer, wherein said solder pad on the wafer locating plate (28) is adjacent to the corresponding electrode soldering pad on said wafer, wherein the two solder pads are directly soldered together and communicate through merely the soldering flux (30).

16. The LED chip according to claim 13, characterized in that: an entire corner of said wafer is cut off, an electrode solder pad is provided on the side wall of said cutaway corner, wherein said solder pad on the wafer locating plate (28) is adjacent to said electrode solder pad on the side wall of said cutaway corner, wherein the two solder pads are directly soldered together and communicate through merely the soldering flux (30).

17. The LED chip according to claim 16, characterized in that: said corner of said wafer is cut off to form a quarter circular arc.

18. The LED chip according to claim 9, characterized in that: there is a high voltage insulation layer (4) which is attached directly on and covers said surface B of the heat diffusion plate (2), the thickness of the high voltage insulation layer (4) is more than 0.1 mm.

19. The LED chip according to claim 18, characterized in that: the high voltage insulation layer (4) is an $Al_2O_3$ ceramic, said wafer/wafers are attached to the heat diffusion plate (2) by soldering, a leading wire (9) is penetrated through the high voltage insulation layer (4).

20. The LED chip according to claim 18, characterized in that: the high voltage insulation layer (4) comprises an aluminum oxide membrane which is directly grown or the metal aluminum of said surface B of the heat diffusion plate (2) through an anodization process.

* * * * *